United States Patent
Canella

[19]

[11] Patent Number: 6,112,940
[45] Date of Patent: Sep. 5, 2000

[54] VERTICAL MAGAZINE APPARATUS FOR INTEGRATED CIRCUIT DEVICE DISPENSING, RECEIVING OR STORING

[75] Inventor: Robert L. Canella, Meridian, Id.

[73] Assignee: Micron Electronics, Inc., Nampa, Id.

[21] Appl. No.: 09/008,227

[22] Filed: Jan. 16, 1998

[51] Int. Cl.[7] .................................................. B65H 1/00
[52] U.S. Cl. ........................ 221/198; 221/279; 414/417
[58] Field of Search ............................... 221/13, 14, 197, 221/198, 279, 287, 6; 271/152, 155; 414/417

[56] References Cited

U.S. PATENT DOCUMENTS

| | | | |
|---|---|---|---|
| 3,552,590 | 1/1971 | Zachmeier | 206/56 |
| 4,077,557 | 3/1978 | Green | 227/83 |
| 4,253,585 | 3/1981 | Janisiewicz et al. | 221/242 |
| 4,460,108 | 7/1984 | Noda et al. | 221/94 |
| 4,483,441 | 11/1984 | Akizawa et al. | 206/328 |
| 4,494,902 | 1/1985 | Kuppens et al. | 414/223 |
| 4,564,326 | 1/1986 | Roberts et al. | 414/131 |
| 4,588,342 | 5/1986 | Hirokawa et al. | 414/125 |
| 4,603,248 | 7/1986 | O'Connor | 219/388 |
| 4,632,621 | 12/1986 | Cable | 221/198 |
| 4,647,269 | 3/1987 | Wedel et al. | 414/421 |
| 4,660,710 | 4/1987 | Swapp et al. | 198/397 |
| 4,694,964 | 9/1987 | Ueberreiter | 209/549 |
| 4,703,858 | 11/1987 | Ueberreiter et al. | 209/573 |
| 4,715,501 | 12/1987 | Sato et al. | 209/573 |
| 4,724,965 | 2/1988 | Willberg | 209/573 |
| 4,759,435 | 7/1988 | Cedrone | 198/459 |
| 4,836,797 | 6/1989 | Riechelmann | 439/264 |
| 4,846,345 | 7/1989 | Hamuro et al. | 206/328 |
| 4,878,801 | 11/1989 | Pearson | 414/411 |
| 4,889,229 | 12/1989 | Yamamoto et al. | 206/328 |
| 4,926,118 | 5/1990 | O'Connor et al. | 324/158 F |
| 4,953,749 | 9/1990 | Kubota et al. | 221/168 |
| 4,964,808 | 10/1990 | Riechelmann | 439/264 |
| 4,979,640 | 12/1990 | Konishi et al. | 221/156 |
| 5,080,258 | 1/1992 | Hinteweiter | 221/279 |
| 5,142,771 | 9/1992 | Merkt et al. | 29/751 |
| 5,143,253 | 9/1992 | Takahashi et al. | 221/197 |
| 5,165,837 | 11/1992 | Schuppert, Jr. et al. | 414/417 |
| 5,190,431 | 3/1993 | Klug et al. | 414/417 |
| 5,207,350 | 5/1993 | Spanton | 221/105 |
| 5,208,529 | 5/1993 | Tsurishima et al. | 324/158 F |
| 5,227,717 | 7/1993 | Tsurishima et al. | 324/158 F |
| 5,307,011 | 4/1994 | Tani | 324/158 F |
| 5,743,428 | 4/1998 | Rankin, III | 221/6 |
| 5,831,856 | 11/1998 | Lin | 364/468.28 |

*Primary Examiner*—Kenneth W. Noland
*Attorney, Agent, or Firm*—Trask, Britt & Rossa

[57] ABSTRACT

An apparatus for dispensing, receiving or storing packaged integrated circuit devices using at least one vertically-oriented, removable, tubular magazine disposed above a controllably-driven, rod-like indexing element extending from a drive below the magazine. A magazine, with an associated indexing element and drive, is configurable as an individual magazine module. The indexing element, under power of the drive, raises or lowers a vertical stack of devices to a desired level adjacent the top of the magazine to dispense or receive an individual device from a feed mechanism, such as a pick-and-place mechanism. A number of magazine modules may be assembled in a multi-module array, which is particularly suitable for binning tested devices, with a sort category being directed to each magazine.

28 Claims, 4 Drawing Sheets

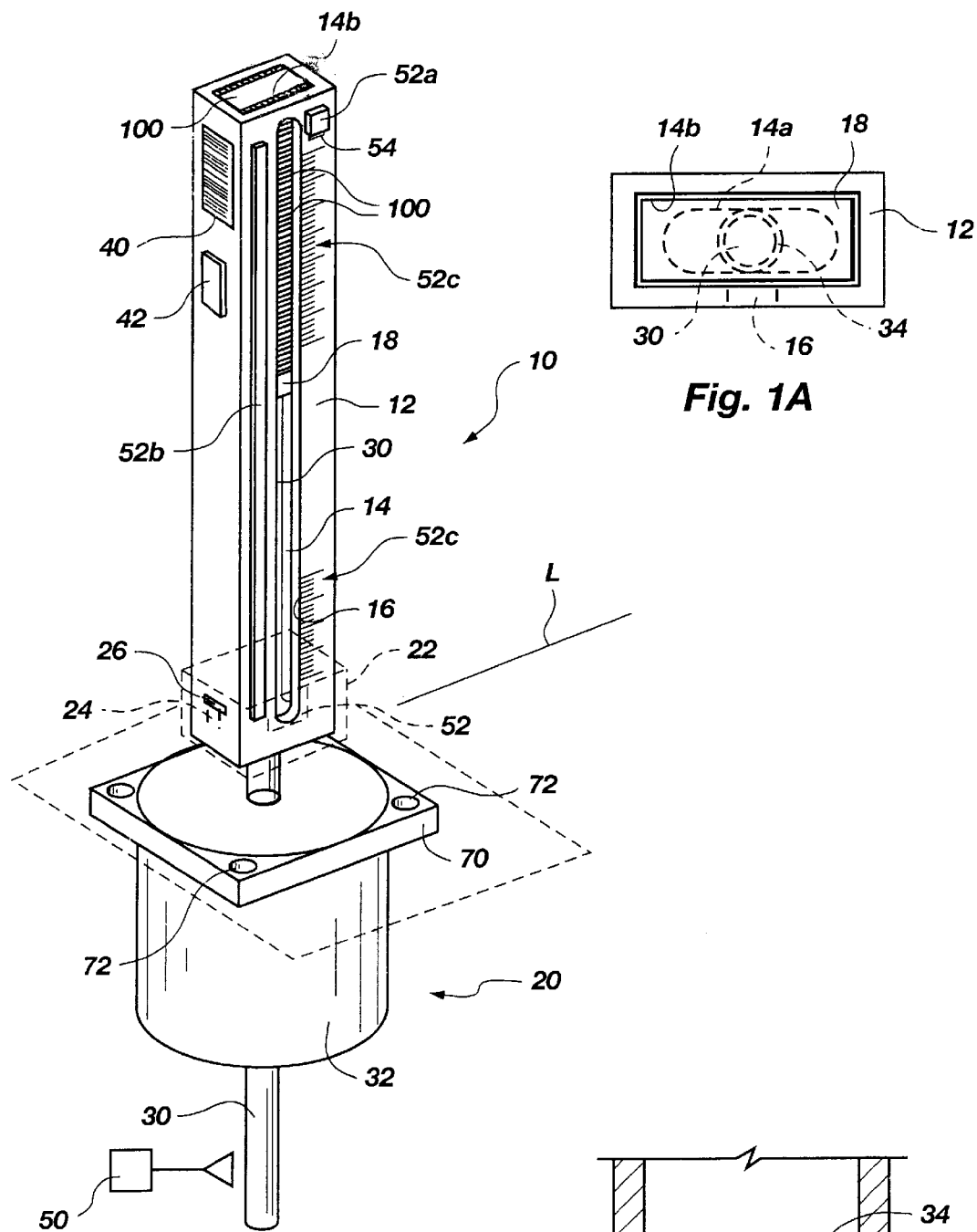
*Fig. 1*
*Fig. 1A*
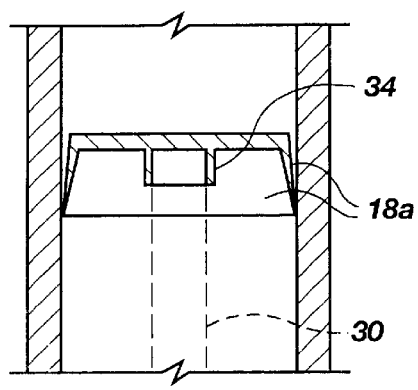
*Fig. 1B*

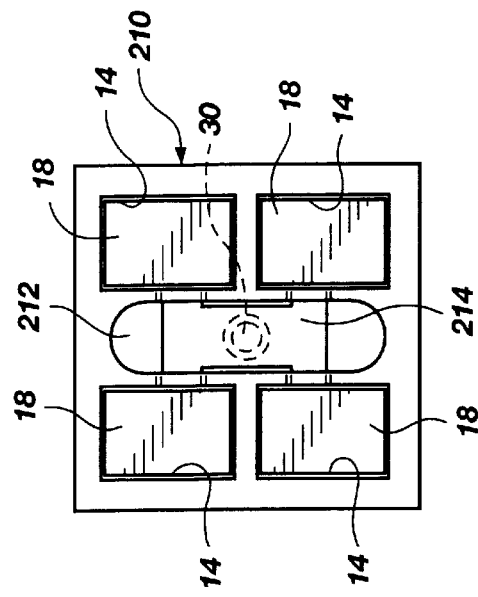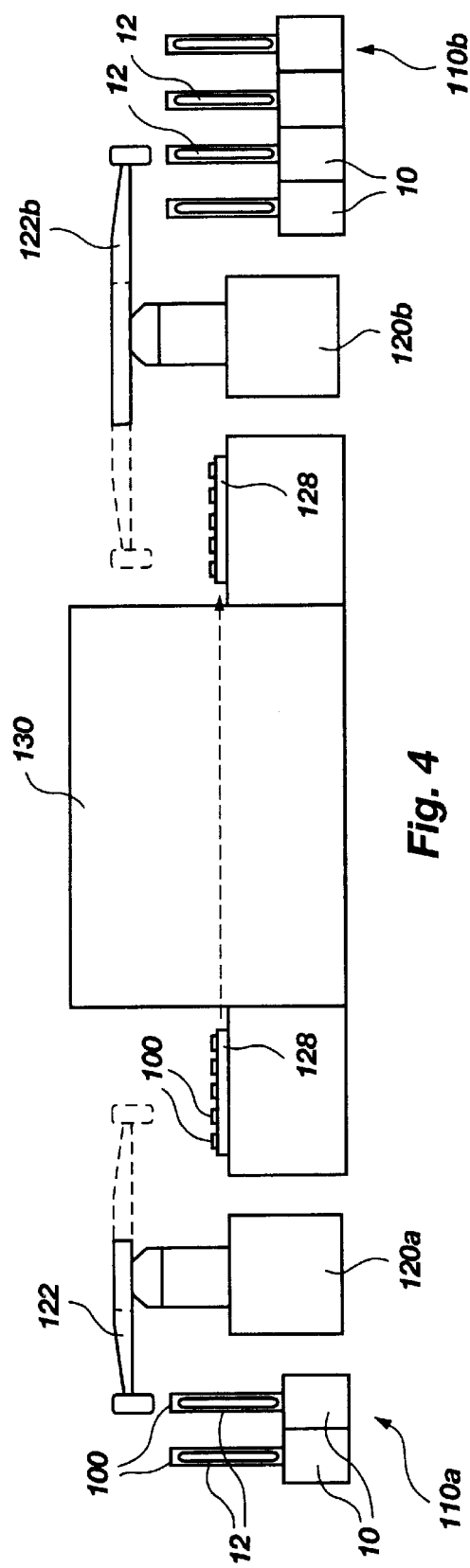

VERTICAL MAGAZINE APPARATUS FOR INTEGRATED CIRCUIT DEVICE DISPENSING, RECEIVING OR STORING

RELATED APPLICATIONS

This application contains subject matter related to U.S. patent application Ser. No. 008,228 filed on even date herewith and entitled Vertical Magazine Method for Integrated Circuit Device Dispensing, Receiving, Storing, Testing or Binning, by the same inventor.

BACKGROUND OF THE INVENTION

The invention relates to apparatus for optionally dispensing, receiving or storing semiconductor devices including integrated circuits and, more specifically, to apparatus employing vertical stacking of such devices in magazines.

As the semiconductor industry advances in the fabrication and processing of packaged semiconductor devices (sometimes referred to herein for convenience as "devices"), such as thin small outline packages, or TSOPs, testing and sorting of such devices pose challenges in terms of device throughput, test equipment space utilization, and device distribution responsive to test result-responsive sorting.

Currently, processing of thin package devices such as TSOPs is primarily carried out based upon specialized JEDEC (Joint Electronic Device Engineering Council)—specification trays, which are approximately five inches wide by twelve inches long. The JEDEC tray design dictates that the semiconductor devices are carried in a single layer, arranged in mutually perpendicular rows and columns. Tray density, or the number of devices carried by each tray, obviously decreases as device size increases. For reference purposes, if a given device is 0.400 inch wide by 0.750 inch long, a JEDEC tray part capacity, with a nine row by thirteen column configuration, is about 117 parts per tray.

Testing of the devices is conventionally carried out in batches of thirty-two parts (devices) run through a test cycle simultaneously. The devices are then sorted into a number of categories based upon test results and then "binned" into the aforementioned JEDEC trays by a conventional "pick-and-place" robotic arm system. At the present time, as many as sixteen sort categories are employed, and it is anticipated that the number of sort categories will increase as the sophistication and miniaturization of semiconductor devices continue in the future. If each JEDEC tray employed for receiving post-test devices is intended to receive a single bin or sort category, a substantial amount of manufacturing floor space is required to accommodate an arrangement where sixteen JEDEC trays are placed in a horizontal array. Further, the size and complexity of the pick-and-place device required to place tested devices in the trays of such an array become unreasonable. Alternatively, if (for example) sixteen JEDEC trays are stacked in a holding tower in a vertical format, wherein the trays themselves are again horizontally oriented but mutually vertically superimposed, a tray retrieval and presentation mechanism is required. Further, the time to retrieve each tray from the tower, present it for pick-and-placement of a tested device, and replace the tray in the tower severely limits device throughput. As the number of sort categories increases, each of the foregoing approaches to device binning becomes ever-more unwieldy to execute.

Thus, the prior art approach to semiconductor device sorting and binning has demonstrated severe deficiencies in terms of throughput, space utilization, and complexity of required device handling equipment.

BRIEF SUMMARY OF THE INVENTION

The present invention affords a simple, elegant and economical solution to the previously-identified problems with device sorting and binning. By employing a vertical binning approach instead of the prior art horizontal binning approach, embodiments of the present invention offer the ability to simulate the horizontal spatial configuration or "footprint" of a JEDEC tray for convenience of use with conventional, unmodified robotic pick and place equipment. Additional embodiments of the invention enable the binning of tested and sorted devices into an extremely high number of categories in a rapid, accurate manner and subsequent storage, transport and dispensing of the binned devices for subsequent operations.

One embodiment of the invention includes at least one elongated magazine configured for containing a plurality of semiconductor devices, including by way of example thin package devices, in a stacked configuration. The magazine is mounted substantially vertically and removably associated with an indexing element of an elevation assembly, the indexing element being movable to regulate the internal longitudinal volume of the interior of the magazine, in order to receive or present a device at a desired level proximate the top of the magazine from a stack of devices within the magazine. The indexing element may be driven by a stepper motor or other incrementally or continuously controllable drive employed in the elevation assembly to ensure presentation or receipt of the top device in the magazine at a correct, controllable vertical height for easy access by a pick and place system. The magazine and elevation assembly together may be said to comprise a magazine unit.

It is currently contemplated that a best mode of implementation of the invention may involve a plurality of magazine units in modular form placed in an array, each including a removable, vertically extending magazine placed in close mutual horizontal proximity and, if desired, in a pattern to simulate at least some of the rows and columns exhibited by the aforementioned JEDEC trays. Thus, each magazine is associated with an indexing element responsive to a separately-controllable drive of a discrete elevation assembly for raising or lowering a stack of devices within that magazine to either present an uppermost device in a magazine stack for retrieval, or to lower an uppermost device in a stack to provide a location for placement of another device in that magazine.

Embodiments of the invention also include a method of binning devices and a method of dispensing stored devices for further handling.

BRIEF DESCRIPTION OF THE SEVERAL VIEWS OF THE DRAWINGS

FIG. 1 is a perspective view of a single magazine module embodiment of the invention;

FIG. 1A is a top elevation of the magazine depicted in FIG. 1;

FIG. 1B is a side sectional elevation of a mid-portion of the magazine depicted in FIG. 1;

FIG. 3 is a top view of a single magazine embodiment configured for containment of multiple vertical stacks of devices;

FIG. 4 is a schematic depicting dispensing, testing, and binning of devices according to the present invention;

DETAILED DESCRIPTION OF THE INVENTION

Figure 2:
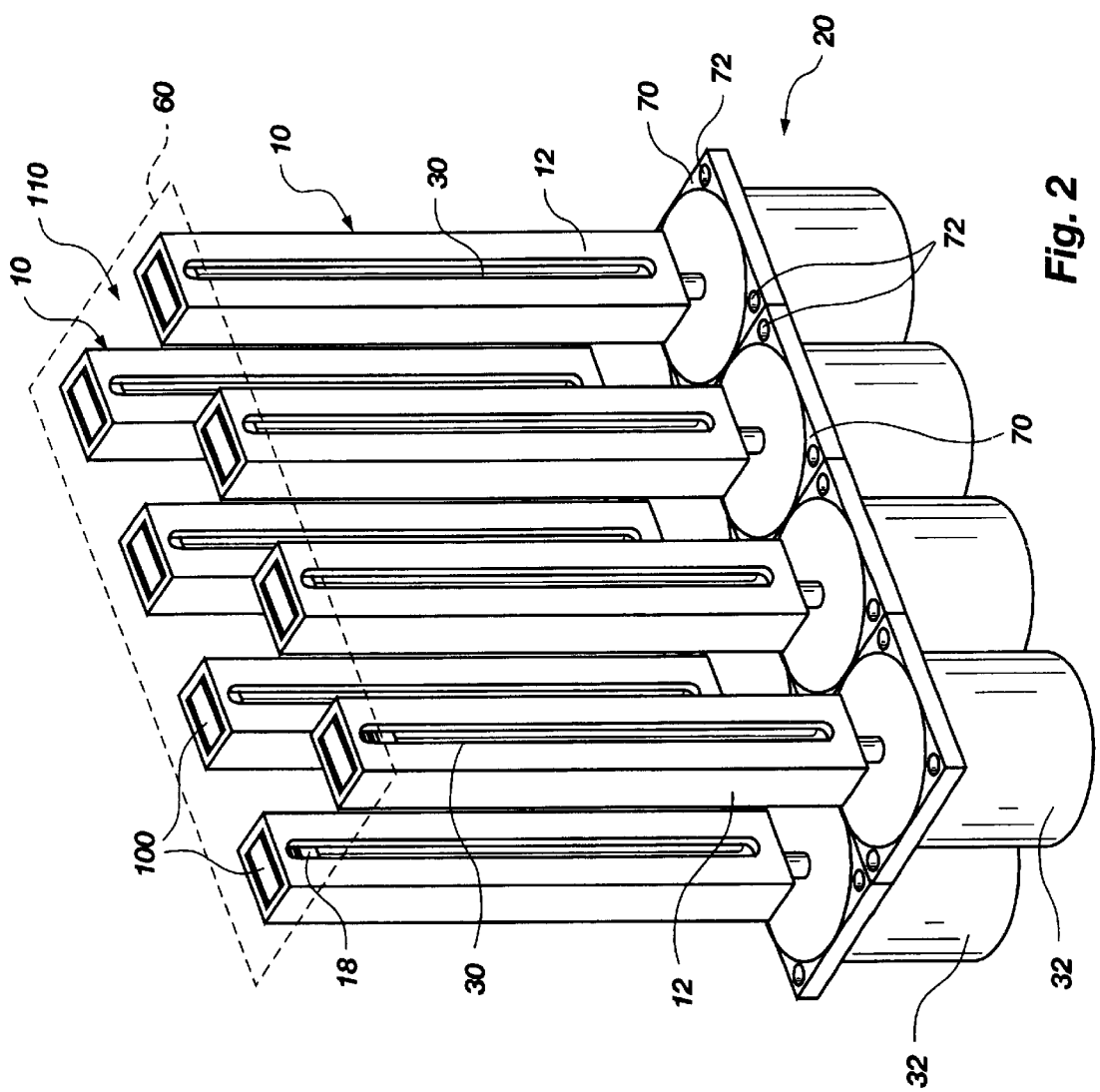
FIG. 2 is a perspective view of a multiple-magazine module embodiment of the invention.

Referring to FIG. 1, magazine unit 10 comprises an elongated, generally tubular magazine 12 defining an interior cavity 14 the cross section of which may be varied in size and shape responsive to that of the devices 100 (such as the aforementioned TSOPs) to be contained therein. Magazine 12 may be formed of any suitable metallic or non-metallic material, although it is contemplated that it be molded from an anti-electrostatic discharge (ESD) polymer, or coated with such a material. As shown, magazine cavity 14 is sized to accommodate a plurality of devices 100 stacked in vertically superimposed relationship. Also as shown, one or more walls of magazine 12 may include an elongated view port 16, so that the filled versus empty status of the magazine may be visually verified as desired. It is also desirable that magazine 12 include a floor 18 movable within interior cavity 14. As shown in FIG. 1A, floor 18 is preferably larger than aperture 14a at the bottom of interior cavity 14, so that devices 100 in magazine 12 will be retained from below by floor 18 when magazine 12 is being handled. As shown in FIG. 1B, floor 18 may include skirts or other peripheral extensions 18a to prevent tilting, cocking and jamming of floor 18 as it moves up and down within magazine cavity 14.

Magazine 12 is placed above an elevation assembly 20 at a fixed vertical level L, and may be stabbed into a fixture, depicted in FIG. 1 as receptacle 22 (shown in broken lines), to provide proper horizontal, vertical and angular (about a vertical axes) orientation for magazine 12. It is preferred, although not required, that magazine 12 be secured against vertical movement by a detent assembly comprised of one or more resiliently-biased detent elements 24 cooperating with a like number of recesses 26 in a sidewall of magazine 12. The detent assembly may comprise a leaf-spring biased detent element as shown, or biasing may be provided by a coil spring, a resilient elastomer, or otherwise as known in the art, or may comprise a resilient wall portion molded into receptacle 22. Alternatively, magazine 12 may be frictionally retained within receptacle 22, or may be positively locked within receptacle 22 by a latch or pin-type locking arrangement, such mechanisms being conventional.

An elongated, rod-like indexing element 30 is extendable upwardly into interior cavity 14 of magazine 12 under the power and control of drive 32, which may comprise a stepper motor, a screw drive, or other suitable incrementally or continuously controllable drive mechanism as known in the art. As shown, indexing element 30 extends vertically through drive 32 and upwardly into magazine 12, where it contacts the bottom of floor 18. As shown in FIGS. 1A and 1B, element 30 may be received within a cup 34 formed in the bottom of floor 18. Cup 34, like skirts 18a, may alleviate any tendency of floor 18 to tilt, cock or jam. If desired, the upper end of indexing element 30 may be of rectangular or other suitable cross section, and the interior blind bore of cup 34 configured to mate therewith. Drive 32 may be controlled responsive to removal or addition of a device to its associated magazine 12 by a pick-and-place mechanism to, respectively, extend or retract indexing element 30 by an increment equivalent to the depth (thickness) of a given device 100. Such movement may be software-controlled for ease of accommodating different devices 100.

Optionally and desirably, each magazine 12 may carry identifying indicia or an identification device thereon to facilitate proper identification and use of a given magazine and its contents. For example, as shown in FIG. 1, magazine 12 may bear an identification device 40 such as a bar code or magnetic strip (such as is employed with credit cards) on an exterior sidewall thereof. Alternatively, and again as shown in FIG. 1, magazine 12 may bear a more sophisticated electronic identification device 42 utilizing a memory device such as an EEPROM or flash memory. An RFID (Radio Frequency Identification) device may also be employed for enhanced remote inventory and theft control through electronic tracking or monitoring. Such bar code 40 or identification devices 42 may be employed to retain and provide "bin" information as to the test characteristics exhibited by the binned devices carried by the magazine, part count, manufacturing origin, test date, test equipment, test protocol, and other useful information, such as the location of a specific part in a stack of parts deposited in a given magazine 12.

As depicted in FIG. 2, a plurality of magazine units 10, optionally in identical modular form (hereinafter "magazine modules"), may be arranged in a close horizontally-adjacent array 110 to dispense or receive devices 100 in association with a pick-and-place mechanism. This arrangement is particularly beneficial for receiving tested and sorted devices 100, with each magazine 12 of the array 110 comprising a "bin" to receive devices exhibiting particular characteristics under test and sorted accordingly. As shown in broken lines 60, the magazine module array 110 may be arranged to simulate the device containment pattern size and shape of the aforementioned JEDEC trays, while eliminating the previously-described conventional practice of presenting different trays for receiving differently binned devices. Moreover, using the invention, a pick-and-place mechanism may thus be programmed to dispense tested, sorted chips to only one specific X–Y plane (transverse to the axes of magazines 12) location for each sort category, or bin, of tested devices.

Figure 5:
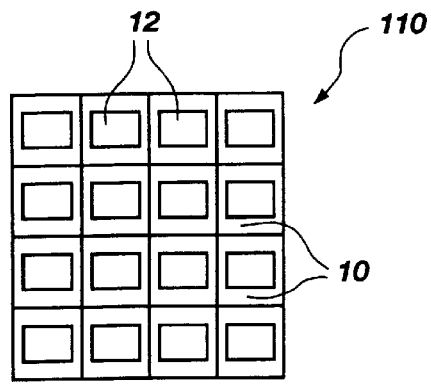
FIG. 5 is a schematic of a square, four magazine module by four magazine module array of one embodiment of the invention.
Figure 6:
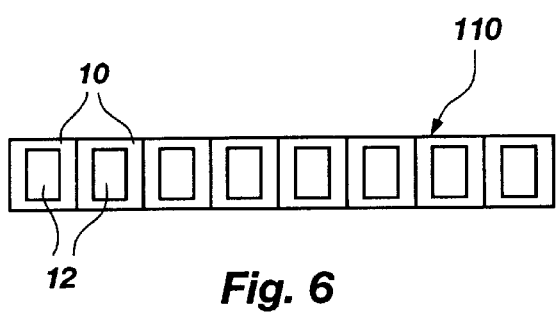
FIG. 6 is a linear, eight magazine module array of one embodiment of the invention.
Figure 7:
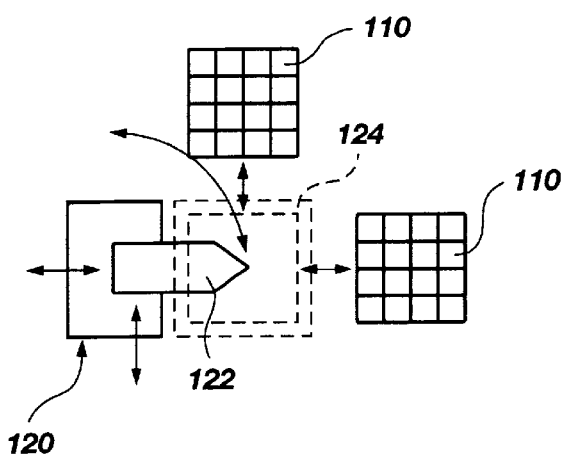
FIG. 7 is a schematic top elevation of two module arrays alternately movable into a target field of a pick-and-place mechanism.
Figure 8:
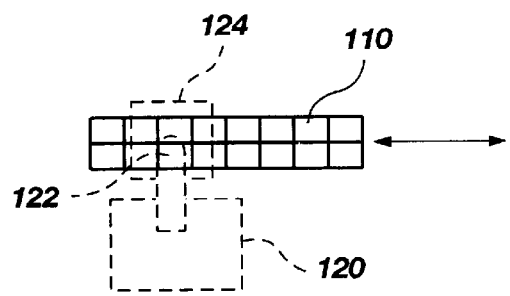
FIG. 8 is a schematic top elevation of an elongated two module-deep linear array translatable across the target field of a pick-and-place mechanism.
Figure 9:
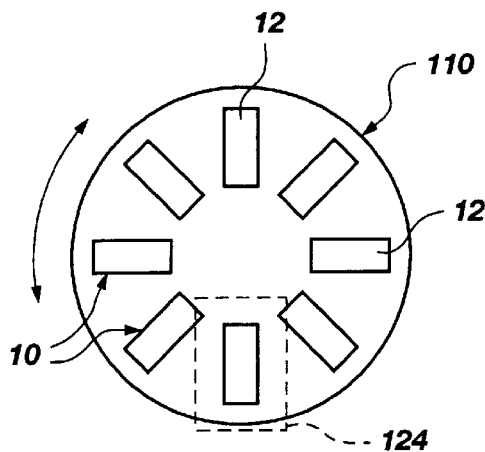
FIG. 9 is a schematic top elevation of a circular, carousel-type array rotatable into the target field of a pick-and-place mechanism.

As desired, the magazine units or modules 10 may be arranged to comprise a square array (for example, four modules 10 by four modules as shown in FIG. 5), another rectangular array (for example, four modules 10 by two modules 10 as shown in FIG. 2), a linear array (for example, a line of eight modules as shown in FIG. 6), or in any other desired arrangement. Further, and again as desired, two or more module arrays 110 may be employed if a large number of bins are required and the pick-and-place device 120 has a limited horizontal travel, the multiple arrays 110 being alternatively placeable within reach of a target field 124 of the pick-and-place arm 122, as shown in FIG. 7. Also, a longitudinally extended module array 110 may be mounted so as to be linearly translatable through a target field 124 of a pick and place arm 122, as shown in FIG. 8. Finally, and as illustrated in FIG. 9, a circular carousel-type array 110 may be employed to rapidly, rotationally present each magazine module 10 at the same, specific, fixed target field 124 for pick-and-place.

As shown in both FIGS. 1 and 2, the magazine modules 10 may be easily bolted or otherwise secured by fasteners to a module or array support plate in any desired pattern and spacing using apertures 72 in flange plates 70 at the tops of drives 32. Alternatively, the magazine modules 10 may be frictionally seated in recesses in a support, spring-loaded or positively-locked clamps may be employed to retain magazine modules 10, resiliently-biased detent devices employed, or any other suitable retention structure known in the art. Further, drives 32 may be linked to a test apparatus and sorting device by quick-release electrical connections (such as male-female connectors, resiliently-biased surface contacts, or other suitable connections known in the art).

When a given magazine 12 is completely filled, such status being conveyed to the operator by, for example, a sensor 50 (see FIG. 1) sensing the position of indexing element 30 or a proximity sensor 52 (see FIG. 1) located on the interior of receptacle 22 sensing the proximity of floor 18 to the bottom of that magazine 12, the full magazine 12 is removed and replaced by an empty one. Triggering of such sensors 50, 52 may result in an alarm or other indicator to alert the operator, and a signal to a control system to stop the binning process until the full magazine is replaced. Position sensor 50 may sense actual travel of indexing element 30, or may merely react to proximity of an indicator located on the shaft of indexing element 30. Proximity sensor 52 may comprise a contact switch, a photocell, a reflection type optical encoder, an ultrasound sensor, or other suitable sensor known in the art. In lieu of being associated with receptacle 22, sensor 52 may be built into the lower end of each magazine 12, and electrical contact for providing power and passing a signal from the sensor made with a host device such as a programmed computer associated (for example) with a testing device or a sorting device when magazine 12 is plugged into receptacle 22. Male/female mating contacts, resiliently-biased surface contacts, or other conventional arrangement may be employed to make the connection.

Position sensor 50 might also be employed to indicate when a dispensing magazine 12 has been emptied (i.e, indexing element 30 is at full extension), and a proximity sensor 52a might be employed at the top of each dispensing magazine 12 to signal the proximity of floor 18 to the mouth 14b of interior magazine cavity 14, sensor 52a having a quick-disconnect electrical connection 54 associated therewith for connecting sensor 52a to an alarm or other indicator, to the control for the mechanism being fed by the magazine, and to the control for elevator drive 32. Alternatively, the connection for sensor 52a may be located at the bottom of magazine 12 so that entry of the bottom of magazine 12 into a receptacle 22 also effects an electrical connection for the sensor. Further, the sensor may extend longitudinally along the vertical length of the magazine as shown at 52b, to sense the proximity of the floor 18 in a continuous manner, and thus the magnitude of the interior cavity 14 of the magazine 12 above floor 18 on a continuous basis. In a very simple form, the "sensor" may comprise a graduated indicator scale 52c inscribed on the exterior of magazine 12 next to view port 16 in gradations equal to the thickness of the devices contained therein and numbered to visually indicate the number of devices in the magazine, the remaining magazine capacity, or both. Alternatively, the scale 52c may be printed on an adhesive-backed strip or film to be removably adhered to a magazine 12 so that different scales may be used for devices of different thicknesses.

As shown in FIG. 3, the magazine of the present invention may be configured in an embodiment 210 to present or receive a plurality, for example four (4), of devices 100 by employing four interior cavities 14 arranged about a central passage 212 for receiving an indexing element 30, the floors 18 within the four cavities 14 being linked to a central support 214 which is engaged by indexing element 30.

FIG. 4 schematically depicts the dispensing of devices 100 from an array 110a of magazine units 10 according to the present invention, retrieval with arm 122a of a pick-and-place mechanism 120a and placement into a test board preparatory to passage through test apparatus 130 for electrical testing (optionally at elevated temperature) and sorting of devices 100 as known in the art, retrieval of tested devices 100 with arm 122b of a second pick-and-place mechanism 120b and binning of same into additional magazine units 10 in an array 110b in accordance with their exhibited test characteristics. Other types of device handling mechanisms may also be employed, and it is specifically contemplated that a translatable chute-type gravity feed mechanism is suitable for dispensing tested devices 100 into various magazines 10 in accordance with their test characteristics. Many types of such electrical tests being known and conventionally practiced in the art, and the type of such tests being unrelated to the present invention and its practice, no further description thereof will be made herein.

The present invention has been disclosed as having specific utility with TSOP devices. However, it is contemplated as having utility with any type of semiconductor device, particularly packaged devices such as (for example) small outline j-lead (SOJ) devices, thin quad flat pack (TQFP) devices, dual-in-line package (DIP) devices, ball grid array (BGA) devices, and chip scale package (CSP) devices.

While the present invention has been described in terms of certain illustrated embodiments, those of ordinary skill in the art will readily recognize that it is not so limited. Many additions, deletions and modifications may be made to the embodiments disclosed, as well as combinations of features from different disclosed embodiments, without departing from the scope of the invention as hereinafter claimed.

What is claimed is:

1. An apparatus adapted for receiving or dispensing semiconductor devices, comprising:
    a drive having an associated movable element; and
    an elongated tubular magazine defining at least one interior cavity having a mouth, said magazine securable in a substantially vertical orientation above said drive with said movable element positionable to regulate a longitudinal volume below said mouth within said at least one interior cavity.

2. The apparatus of claim 1, wherein said movable element comprises an elongated element extendable upwardly from said drive.

3. The apparatus of claim 2, wherein said movable element is extendable into said magazine when said magazine is secured above said drive.

4. The apparatus of claim 1, wherein said magazine includes a floor longitudinally movable within said at least one interior cavity, and said movable element is engageable with said floor to regulate said longitudinal volume within said at least one interior cavity responsive to movement of said movable element.

5. The apparatus of claim 4, wherein said magazine is configured to retain said floor within said at least one interior cavity when said magazine is not engaged by said movable element.

6. The apparatus of claim 1, further including a fixture for receiving a lower end of said magazine in a fixed orientation above said drive.

7. The apparatus of claim 6, further including a locking mechanism for securing said magazine to said fixture.

8. The apparatus of claim 1, further including a device for ascertaining a magnitude of said regulated longitudinal volume.

9. The apparatus of claim 8, wherein said device comprises a sensor for detecting said magnitude responsive to at least one position of said movable element.

10. The apparatus of claim 8, wherein said magazine further includes a floor longitudinally movable within said at least one interior cavity, and said device comprises a sensor for detecting said magnitude responsive to at least one position of said floor.

11. The apparatus of claim 1, further including an identification device associated with said magazine.

12. The apparatus of claim 11, wherein said identification device is selected from a group comprising a bar code, a magnetic strip and an electrical circuit including memory.

13. An apparatus adapted for receiving or dispensing semiconductor devices at a plurality of laterally adjacent locations, comprising:

an array of laterally adjacent magazine units, each including:
a drive having an associated movable element; and
an elongated tubular magazine defining at least one interior cavity having a mouth, said magazine securable in a vertical orientation above said drive with said movable element positionable to regulate a longitudinal volume below said mouth within said at least one interior cavity.

14. The apparatus of claim 13, wherein said movable element comprises an elongated element extendable upwardly from said drive.

15. The apparatus of claim 14, wherein said movable element is extendable into said magazine when said magazine is secured above said drive.

16. The apparatus of claim 13, wherein said magazine includes a floor longitudinally movable within said at least one interior cavity, and said movable element is engageable with said floor to regulate said longitudinal volume within said at least one interior cavity responsive to movement of said movable element.

17. The apparatus of claim 16, wherein said magazine is configured to retain said floor within said at least one interior cavity when said magazine is not engaged by said movable element.

18. The apparatus of claim 13, further including a fixture for receiving a lower end of said magazine in a fixed orientation above said drive unit.

19. The apparatus of claim 18, further including a locking mechanism for securing said magazine to said fixture.

20. The apparatus of claim 13, further including a device for ascertaining a magnitude of said regulated longitudinal volume.

21. The apparatus of claim 20, wherein said device comprises a sensor for detecting said magnitude responsive to at least one position of said movable element.

22. The apparatus of claim 20, wherein said magazine further includes a floor longitudinally movable within said at least one interior cavity, and said device includes a sensor for detecting said magnitude responsive to at least one position of said floor.

23. The apparatus of claim 13, further including an identification device associated with said magazine.

24. The apparatus of claim 23, wherein said identification device is selected from the group comprising a bar code, a magnetic strip and an electrical circuit including memory.

25. An apparatus for binning semiconductor devices sorted into at least two categories according to characteristics exhibited under test, comprising:

a mechanism for retrieving semiconductor devices subsequent to said test and dispensing said retrieved semiconductor devices within a target field; and at least one array of mutually laterally adjacent, upright elongated magazines locatable within said target field for receiving said dispensed semiconductor devices according to sort category.

26. The apparatus of claim 25, wherein said at least one array is movable to positions both within and outside of said target field, and further including at least another array movable to positions within and outside of said target field.

27. The apparatus of claim 25, wherein said at least one array extends beyond said target field, and is movable so that each magazine of said array is placeable within said target field.

28. The apparatus of claim 27, wherein said at least one array is rotatable.

* * * * *

UNITED STATES PATENT AND TRADEMARK OFFICE
CERTIFICATE OF CORRECTION

PATENT NO. : 6,112,940
DATED : September 5, 2000
INVENTOR(S) : Canella

It is certified that error appears in the above-identified patent and that said Letters Patent is hereby corrected as shown below:

<u>Drawings,</u>
Fig. 4, change reference number "122" on left side to -- 122a --

<u>Column 2,</u>
Lines 29-30, change "pick and place" to -- pick-and-place --;

<u>Column 3,</u>
Line 18, after "14" insert --,-- and change "cross section" to -- cross-section --;
Line 43, change "axes" to -- axis --;

<u>Column 4,</u>
Line 1, change "cross section" to -- cross-section --;
Line 62, change "pick and place" to -- pick-and-place --;

<u>Column 5,</u>
Line 28, before "sensor 52" insert -- proximity --;

<u>Column 6,</u>
Line 2, after "four" insert -- interior --;
Line 7, after "test board" insert -- 128 --; and
Line 18, change "magazines 10" to -- magazines 12 --.

<u>Column 8, claim 18,</u>
Line 3, delete "unit";

<u>Column 8, claim 24,</u>
Line 20, change "the" to -- a --;

UNITED STATES PATENT AND TRADEMARK OFFICE
CERTIFICATE OF CORRECTION

PATENT NO. : 6,112,940
DATED : September 5, 2000
INVENTOR(S) : Canella

It is certified that error appears in the above-identified patent and that said Letters Patent is hereby corrected as shown below:

Column 8, claim 25,
Line 25, after "retrieving" insert -- said --; and

Column 8, claim 27,
Line 38, after "of said" insert -- at least one --.

Signed and Sealed this

Twenty-ninth Day of January, 2002

Attest:

Attesting Officer

JAMES E. ROGAN
*Director of the United States Patent and Trademark Office*